United States Patent
Kubota

(10) Patent No.: US 11,380,513 B2
(45) Date of Patent: Jul. 5, 2022

(54) AUTOFOCUS METHOD FOR A SCANNING ELECTRON MICROSCOPE

(71) Applicant: TASMIT, INC., Yokohama (JP)

(72) Inventor: Daisuke Kubota, Yokohama (JP)

(73) Assignee: TASMIT, INC., Yokohama (JP)

( * ) Notice: Subject to any disclaimer, the term of this patent is extended or adjusted under 35 U.S.C. 154(b) by 0 days.

(21) Appl. No.: 16/965,850

(22) PCT Filed: Jan. 18, 2019

(86) PCT No.: PCT/JP2019/001468
§ 371 (c)(1),
(2) Date: Jul. 29, 2020

(87) PCT Pub. No.: WO2019/155850
PCT Pub. Date: Aug. 15, 2019

(65) Prior Publication Data
US 2021/0027979 A1 Jan. 28, 2021

(30) Foreign Application Priority Data
Feb. 7, 2018 (JP) .............................. JP2018-019772

(51) Int. Cl.
*H01J 37/21* (2006.01)
*H01J 37/147* (2006.01)
*H01J 37/28* (2006.01)

(52) U.S. Cl.
CPC .......... *H01J 37/21* (2013.01); *H01J 37/1474* (2013.01); *H01J 37/28* (2013.01); *H01J 2237/216* (2013.01)

(58) Field of Classification Search
CPC .......... H01J 37/00; H01J 37/02; H01J 37/023; H01J 37/21; H01J 37/22; H01J 37/222; H01J 37/26; H01J 37/28
(Continued)

(56) References Cited

U.S. PATENT DOCUMENTS

2009/0242761 A1* 10/2009 Yeh .......................... H01J 37/28
250/307
2011/0274341 A1* 11/2011 Shirahata .............. H01J 37/265
382/145
(Continued)

FOREIGN PATENT DOCUMENTS

JP 10-154479 A 6/1998
JP 2005-142038 A 6/2005
(Continued)

OTHER PUBLICATIONS

International Patent Application No. PCT/JP2019/001468, International Search Report and Written Opinion dated Apr. 9, 2019, 7 pgs.

*Primary Examiner* — Jason L McCormack
(74) *Attorney, Agent, or Firm* — Lathrop GPM LLP

(57) ABSTRACT

The present invention relates to an autofocus technique for a scanning electron microscope using interlaced scan. The autofocus method for a scanning electron microscope, includes: generating a thinned image of a pattern (160) formed on a surface of a specimen by repeatedly scanning the specimen with an electron beam while shifting a scanning position of the electron beam by predetermined plural pixels in a direction perpendicular to a scanning direction; performing said generating a thinned image of the pattern (160) plural times, while changing a focal position and an irradiation position of the electron beam, to generate thinned images of the pattern (160); calculating a plurality of sharpness levels of the respective thinned images; and determining an optimum focal position based on the sharpness levels.

8 Claims, 7 Drawing Sheets

(58) Field of Classification Search
USPC .......................................... 250/306, 307, 311
See application file for complete search history.

(56) References Cited

U.S. PATENT DOCUMENTS

| 2014/0042317 | A1* | 2/2014 | Khursheed | ............ | H01J 37/261 |
| | | | | | 250/310 |
| 2016/0240348 | A1* | 8/2016 | Yokosuka | ............... | H01J 37/22 |
| 2016/0284506 | A1* | 9/2016 | Ogawa | .................... | H01J 37/20 |

FOREIGN PATENT DOCUMENTS

| JP | 2007-109408 A | 4/2007 |
| WO | WO 2010/082477 A1 | 7/2010 |

* cited by examiner

AUTOFOCUS METHOD FOR A SCANNING ELECTRON MICROSCOPE

CROSS-REFERENCE TO RELATED APPLICATIONS

This application is a 35 U.S.C. § 371 filing of International Application No. PCT/JP2019/001468 filed Jan. 18, 2019, which claims the benefit of priority to Japanese Patent Application No. 2018-019772 filed Feb. 7, 2018, each of which is incorporated herein by reference in its entirety.

TECHNICAL FIELD

The present invention relates to an autofocus technique for a scanning electron microscope, and more particularly to an autofocus technique using interlaced scan.

BACKGROUND ART

A scanning electron microscope is used for wafer inspection, such as measuring of dimensions of interconnect patterns formed on a surface of a wafer and detecting of defects in interconnect patterns. The scanning electron microscope generally has an autofocus function of automatically focusing an electron beam on a surface of a wafer. FIG. 11 is a schematic diagram for explaining a conventional autofocus technique. As shown in FIG. 11, a scanning electron microscope generates a plurality of images while slightly shifting a focal position, and calculates a sharpness of each image. More specifically, the scanning electron microscope performs differential processing on each image and calculates a sharpness of a pattern edge on each image. Then, the scanning electron microscope determines a focal position corresponding to an image with the highest sharpness.

CITATION LIST

Patent Literature

Patent document 1: Japanese laid-open patent publication No. 2007-109408

SUMMARY OF INVENTION

Technical Problem

However, the conventional autofocus technique requires a certain long time to generate a plurality of images as shown in FIG. 11. As a result, a throughput of the wafer inspection is lowered. Moreover, since a wafer is repeatedly irradiated with an electron beam for generating the plurality of images, a film (for example, a resist) forming a surface of the wafer is electrically charged. As a result, a pattern shape appearing on the image may be distorted, or a brightness may become non-uniform.

It is therefore an object of the present invention to provide a method capable of completing focus adjustment in a short time and capable of preventing electrical charging of a specimen.

Solution to Problem

In an embodiment, there is provided an autofocus method for a scanning electron microscope, comprising: generating a thinned image of a pattern formed on a surface of a specimen by repeatedly scanning the specimen with an electron beam while shifting a scanning position of the electron beam by predetermined plural pixels in a direction perpendicular to a scanning direction; performing said generating a thinned image of the pattern plural times, while changing a focal position and an irradiation position of the electron beam, to generate thinned images of the pattern; calculating a plurality of sharpness levels of the respective thinned images; and determining an optimum focal position based on the sharpness levels.

In an embodiment, said changing the focal position comprises changing a voltage applied to a deflector of the scanning electron microscope to change the focal position.

In an embodiment, a scanning range of the electron beam when generating the thinned image covers an entire field of view of the scanning electron microscope.

Advantageous Effects of Invention

Each thinned image is constituted by fewer pixels than a normal image. Therefore, the scanning electron microscope can generate a plurality of thinned images in a shorter time. As a result, the focus adjustment can be completed in a shorter time than the conventional autofocus technique. Further, since the plurality of thinned images are images of different portions of a pattern, the same place on the specimen is not repeatedly irradiated with the electron beam when the plurality of thinned images are generated. In other words, the scanning lines of the electron beam do not overlap. Therefore, electrical charging of the specimen is prevented, and the scanning electron microscope can generate an accurate image of the specimen.

DESCRIPTION OF EMBODIMENTS

Hereinafter, embodiments of the present invention will be described with reference to the drawings.

Figure 1:
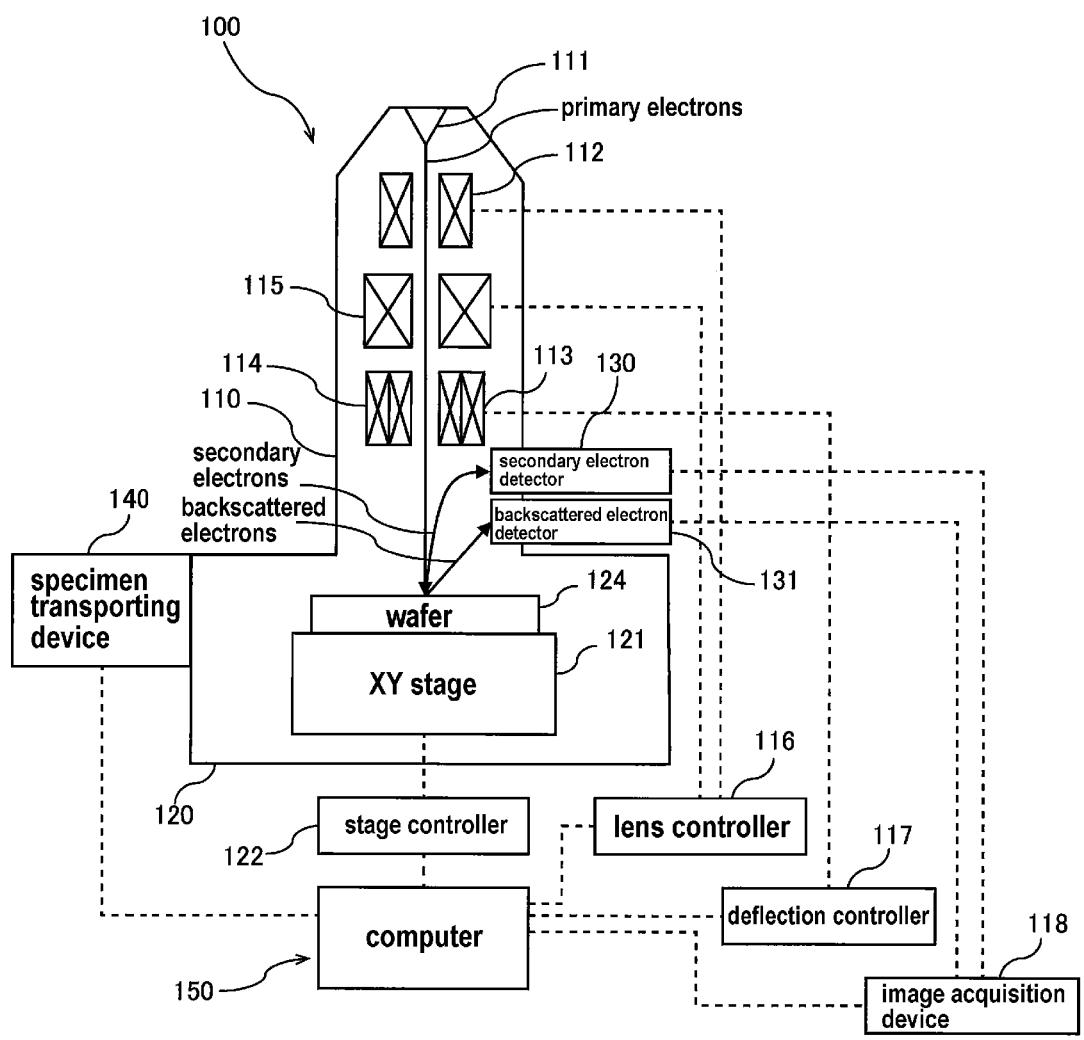
FIG. 1 is a schematic diagram illustrating an embodiment of an image generation system including a scanning electron microscope.

FIG. 1 is a schematic diagram showing an embodiment of an image generation system including a scanning electron microscope. As shown in FIG. 1, the image generation system includes a scanning electron microscope 100 configured to generate an image by scanning a specimen with an electron beam in an X direction and a Y direction perpendicular to each other, and a computer 150 configured to control operations of the scanning electron microscope. The scanning electron microscope 100 includes an electron gun 111 configured to emit an electron beam composed of primary electrons (charged particles), a converging lens 112 configured to cause the electron beam, emitted by the electron gun 111, to converge, an X deflector 113 configured to deflect the electron beam in the X direction, a Y deflector 114 configured to deflect the electron beam in the Y direction, and an objective lens 115 configured to focus the electron beam on a wafer 124 which is an example of a specimen.

The X deflector 113 and the Y deflector 114 are arranged below the objective lens 115. In one embodiment, the X deflector 113 and the Y deflector 114 may be arranged above the objective lens 115. The X direction in which the X deflector 113 deflects the electron beam and the Y direction in which the Y deflector 114 deflects the electron beam are perpendicular to each other.

The converging lens 112 and the objective lens 115 are coupled to a lens controller 116, so that operations of the converging lens 112 and the objective lens 115 are controlled by the lens controller 116. The lens controller 116 is coupled to a computer 150. The X deflector 113 and the Y deflector 114 are coupled to a deflection controller 117, so that the deflection operations of the X deflector 113 and the Y deflector 114 are controlled by the deflection controller 117. This deflection controller 117 is also coupled to the computer 150. A secondary electron detector 130 and a backscattered electron detector 131 are coupled to an image acquisition device 118. The image acquisition device 118 is configured to convert output signals of the secondary electron detector 130 and the backscattered electron detector 131 into images. This image acquisition device 118 is also coupled to the computer 150.

An XY stage 121 is arranged in a specimen chamber 120. This XY stage 121 is coupled to a stage controller 122, so that the position of the XY stage 121 is controlled by the stage controller 122. The stage controller 122 is coupled to the computer 150. A specimen transporting device 140 for placing the wafer 124 onto the XY stage 121 in the specimen chamber 120 is also coupled to the computer 150.

The electron beam, emitted by the electron gun 111, converges by the converging lens 112, and is then deflected by the X deflector 113 and the Y deflector 114 while being focused by the objective lens 115, so that the surface of the wafer 124 is irradiated with the electron beam. When the wafer 124 is irradiated with the primary electrons of the electron beam, secondary electrons and backscattered electrons are emitted from the wafer 124. The secondary electrons are detected by the secondary electron detector 130, and the backscattered electrons are detected by the backscattered electron detector 131. Detection signals of the secondary electrons and detection signals of the backscattered electrons are input to the image acquisition device 118, and converted into images. The images are sent to the computer 150.

The image generation system configured as described above has an autofocus function of automatically focusing the electron beam on a pattern formed on the surface of the wafer 124. The autofocus function of the present embodiment utilizes interlaced scan. Specifically, the image generation system generates a plurality of thinned images of different portions of the pattern formed on the wafer 124, and determines an optimum focal position based on sharpness levels of the obtained thinned images. The autofocus function according to the present embodiment will be described below.

Figure 2:
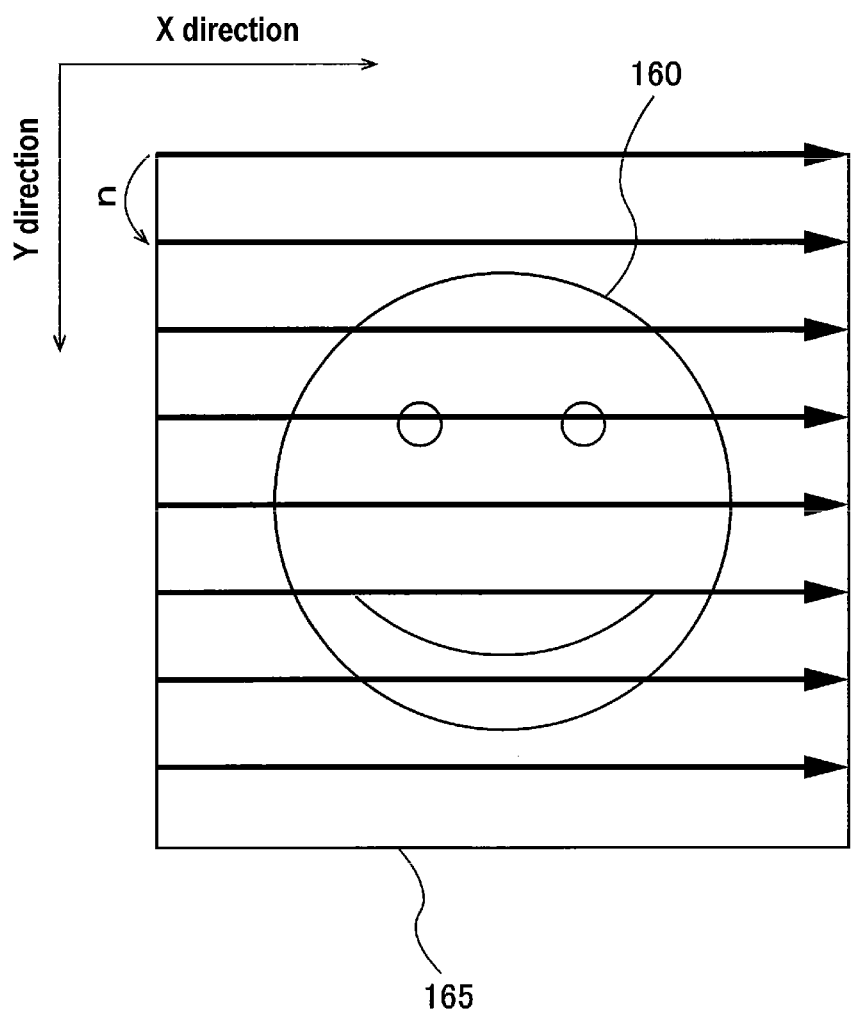
FIG. 2 is a diagram illustrating a process of generating a first thinned image of a pattern.
Figure 3:
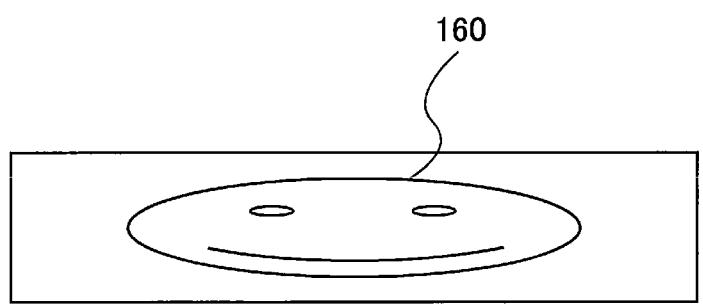
FIG. 3 is a diagram showing the thinned image of the pattern generated by the process shown in FIG. 2.

The electron beam, emitted by the electron gun 111, converges by the converging lens 112, and is then deflected by the X deflector 113 and the Y deflector 114 while being focused by the objective lens 115, so that the electron beam is directed to the surface of the wafer 124. At this time, as shown in FIG. 2, the X deflector 113 and the Y deflector 114 scans the pattern 160 on the wafer 124 with the electron beam repeatedly in the X direction (which is the scanning direction), while shifting the scanning position of the electron beam by predetermined plural pixels in the Y direction perpendicular to the X direction, so that a thinned image of the pattern 160 as shown in FIG. 3 is generated. In the example shown in FIG. 2, the predetermined plural pixels are n pixels (n is a natural number). Since the thinned image is obtained by scanning the wafer 124 at predetermined intervals within a field of view 165 of the scanning electron microscope 100, only a part of the pattern 160 appears on the thinned image.

A scanning range of the electron beam when generating the thinned image of the pattern 160 covers the entire field of view 165 of the scanning electron microscope 100. Specifically, in order to generate one thinned image, as shown in FIG. 2, the electron beam scans from one end to the other end of the preset field of view 165. Therefore, scanning lines of the electron beam when generating one thinned image are uniformly distributed over the entire field of view 165. As described above, since the scanning range of the electron beam extends over the entire field of view 165, a thinned image of the pattern 160 can be obtained even when the pattern 160 is not at the center of the field of view 165. If the pattern 160 is too small compared to the size of the field of view 165, the number of predetermined plural pixels (i.e., n) representing a shifting distance (or a scanning interval) of the scanning position in the Y direction may be reduced, so that the scanning electron microscope 100 can reliably generate a thinned image of the pattern 160.

Further, the scanning electron microscope 100 generates a plurality of thinned images of the pattern 160 by performing the process of generating a thinned image of the pattern 160 plural times while changing the focal position and the irradiation position of the electron beam. More specifically, the scanning electron microscope 100 repeats the process of generating a thinned image of the pattern 160, while shifting an initial scanning position of the electron beam by one pixel in the Y direction and changing the focal position of the electron beam, to thereby generate a plurality of thinned images of the pattern 160.

Figure 4:
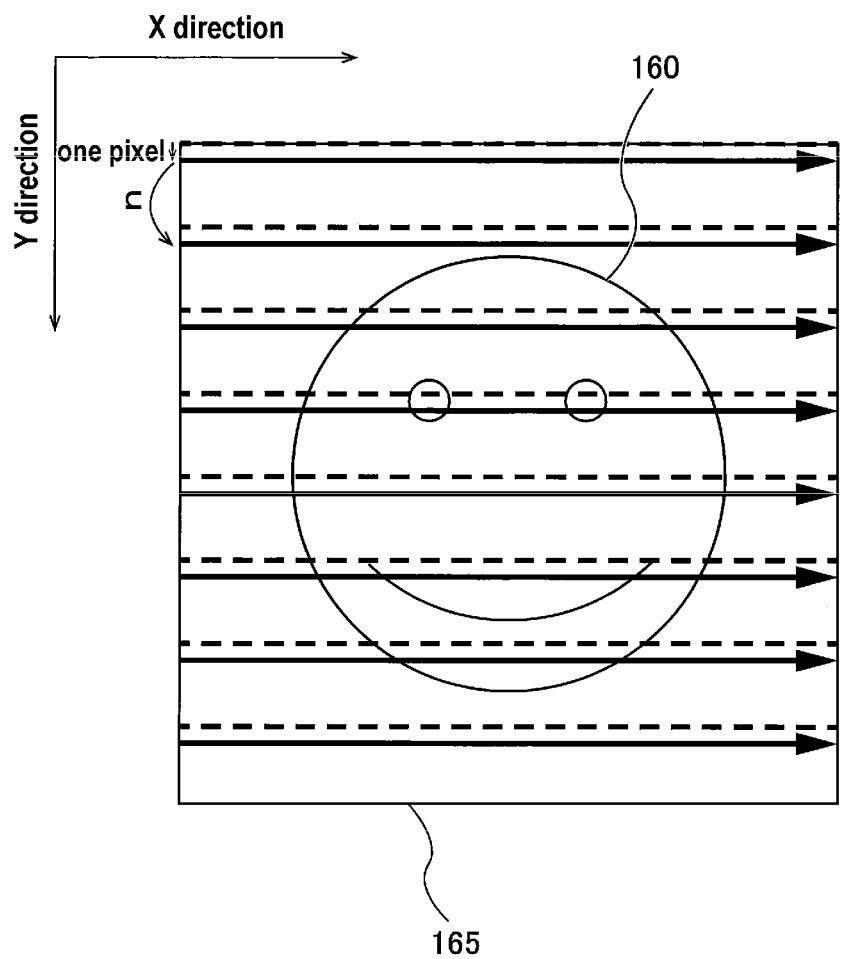
FIG. 4 is a diagram illustrating a process of generating a second thinned image of the pattern.
Figure 5:
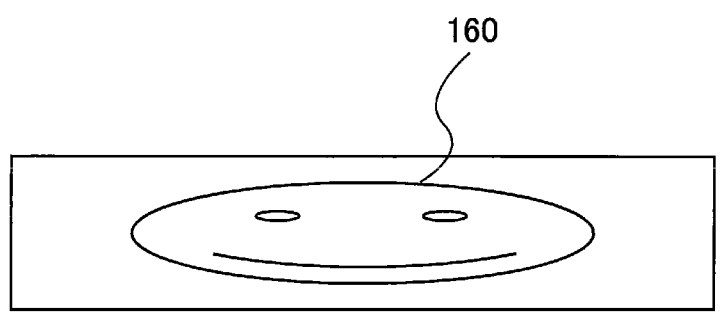
FIG. 5 is a diagram showing a thinned image of the pattern generated by the process shown in FIG. 4.

FIG. 4 is a diagram illustrating a process of generating a second thinned image of the pattern 160. As shown in FIG. 4, the initial scanning position of the electron beam is moved by one pixel in the Y direction. Then, as with the process shown in FIG. 2, the electron beam repeatedly scans the pattern 160 on the wafer 124 in the X direction while the scanning position of the electron beam is sifted by n pixels in the Y direction, so that a thinned image of the pattern 160 as shown in FIG. 5 is generated. As can be seen from a comparison between FIGS. 2 and 4, the electron beam scans portions of the pattern 160 which are different between the process of generating the first thinned image and the process of generating the second thinned image. Therefore, the portion of the pattern 160 appearing on the thinned image shown in FIG. 5 is different from the portion of the pattern 160 appearing on the thinned image shown in FIG. 3.

Figure 6:
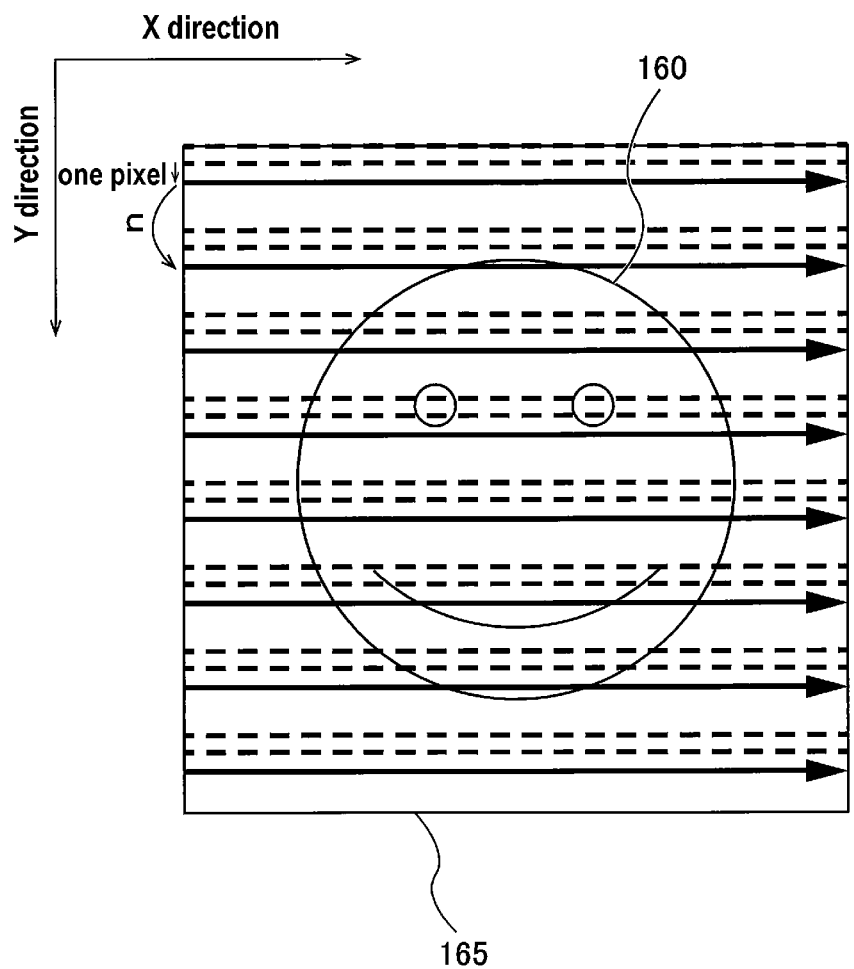
FIG. 6 is a diagram illustrating a process of generating a third thinned image of the pattern.
Figure 7:
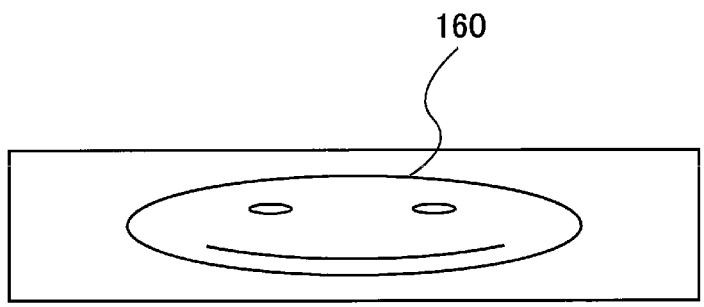
FIG. 7 is a diagram showing the thinned image of the pattern generated by the process shown in FIG. 6.

FIG. 6 is a diagram illustrating a process of generating a third thinned image of the pattern 160. As shown in FIG. 6, the initial scanning position of the electron beam is further moved by one pixel in the Y direction. Then, as with the processes shown in FIG. 2 and FIG. 4, the electron beam repeatedly scans the pattern 160 on the wafer 124 in the X direction while the scanning position of the electron beam is sifted by n pixels in the Y direction, so that a thinned image of the pattern 160 as shown in FIG. 7 is generated. The portion of the pattern 160 appearing on the thinned image shown in FIG. 7 is different from the portions of the pattern 160 appearing on the thinned images shown in FIGS. 3 and 5.

Figure 8:
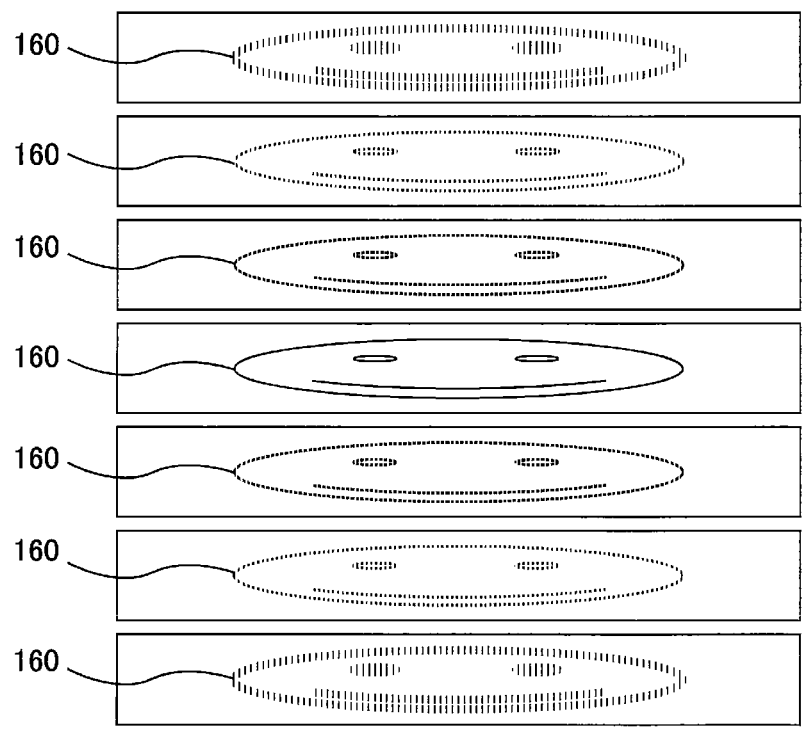
FIG. 8 is a diagram showing a plurality of thinned images.

By repeating the same process while changing the focal position of the electron beam, a plurality of thinned images as shown in FIG. 8 are obtained. When these thinned images are combined, one image in which the pattern 160 repeatedly appears is formed. As described above, the technique of generating the plurality of thinned images of different portions of the pattern 160 and combining these thinned images to obtain one image is called interlaced scan.

In the present embodiment, when the generation of the thinned image is repeated, the focal position of the electron beam is changed by changing voltages applied to the X deflector 113 and the Y deflector 114. More specifically, each time the generation of the thinned image is repeated, the computer 150 instructs the deflection controller 117 to change the voltages applied from the deflection controller 117 to the X deflector 113 and the Y deflector 114.

The X deflector 113 and the Y deflector 114 are usually used for the purpose of deflecting the electron beam, but the X deflector 113 and the Y deflector 114 also have a function of changing the focal position of the electron beam. Specifically, in the present embodiment, when the generation of each thinned image is repeated, the X deflector 113 and the Y deflector 114 change the focal position of the electron beam while deflecting the electron beam. The reason for using the X deflector 113 and the Y deflector 114 for changing the focal position of the electron beam instead of using the objective lens 115 is that the X deflector 113 and the Y deflector 114 can quickly respond to a change in voltage applied, and can therefore more quickly change the focal position of the electron beam than the objective lens 115.

Since the focal position of the electron beam is changed each time the generation of the thinned image of the pattern 160 is repeated, the sharpness levels of the respective thinned images vary as shown in FIG. 8. The sharpness level is an index indicating a sharpness of an edge of the pattern 160 appearing on the image. Specifically, the greater the sharpness level, the closer to the pattern surface the focal position of the electron beam is located. The computer 150 is configured to calculate a plurality of sharpness levels of the respective thinned images, and determine an optimum focal position based on the plurality of sharpness levels.

Figure 9:
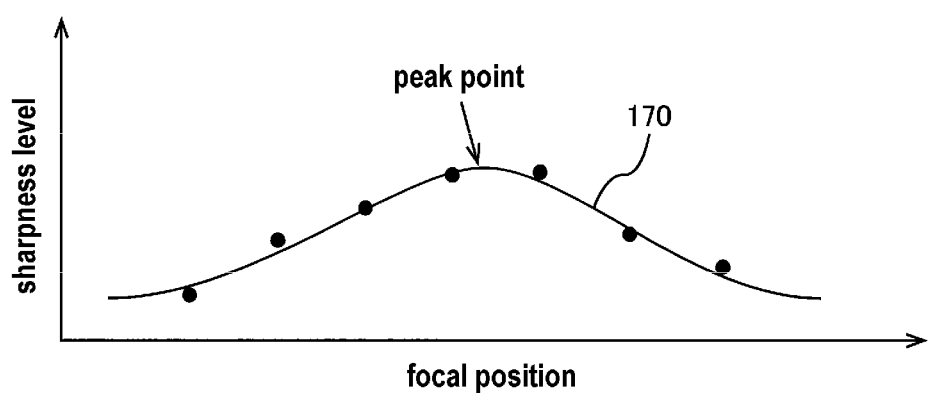
FIG. 9 is a diagram illustrating a process of determining an optimum focal position based on a plurality of sharpness levels.

FIG. 9 is a diagram illustrating an embodiment of a process of determining an optimum focal position based on a plurality of sharpness levels. The computer 150 stores in advance a coordinate system shown in FIG. 9. Vertical axis of the coordinate system represents sharpness level, and horizontal axis represents focal position. The computer 150 calculates differences in brightness between pixels in each thinned image, and adds up the obtained differences to calculate a sharpness level of an edge of the pattern 160 on each thinned image. The computer 150 plots a plurality of points, defined by sharpness levels of the plurality of thinned images and corresponding focal positions, onto the coordinate system, creates an approximate curve 170 of the plurality of points, and determines a focal position corresponding to a peak point of the approximate curve 170. This determined focal position is the optimum focal position. The computer 150 instructs the lens controller 116 to operate the objective lens 115 so as to achieve the determined focal position.

Figure 11:
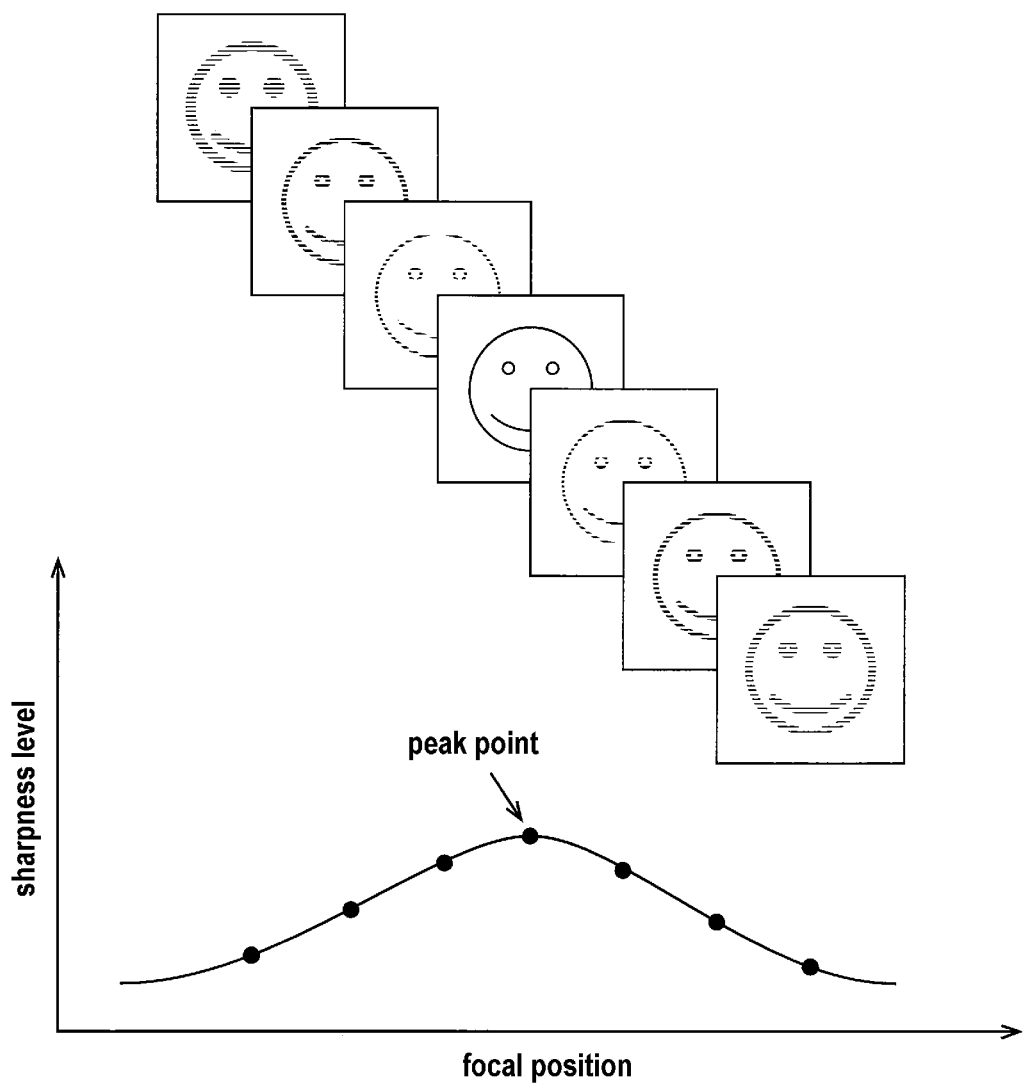
FIG. 11 is a schematic diagram for explaining a conventional autofocus technique.

Each thinned image is constituted by fewer pixels than a normal image as shown in FIG. 11. Accordingly, the scanning electron microscope 100 can generate a plurality of thinned images in a shorter time. Therefore, the focus adjustment can be completed in a shorter time than the conventional autofocus technique. Furthermore, since the plurality of thinned images are images of different portions of the pattern 160 on the wafer 124, the same location of the wafer 124 is not repeatedly irradiated with the electron beam when the plurality of thinned images are generated. In other words, the scanning lines of the electron beam do not overlap. Therefore, electrical charging of the wafer 124 is prevented, and the scanning electron microscope 100 can generate an accurate image of the specimen.

Figure 10:
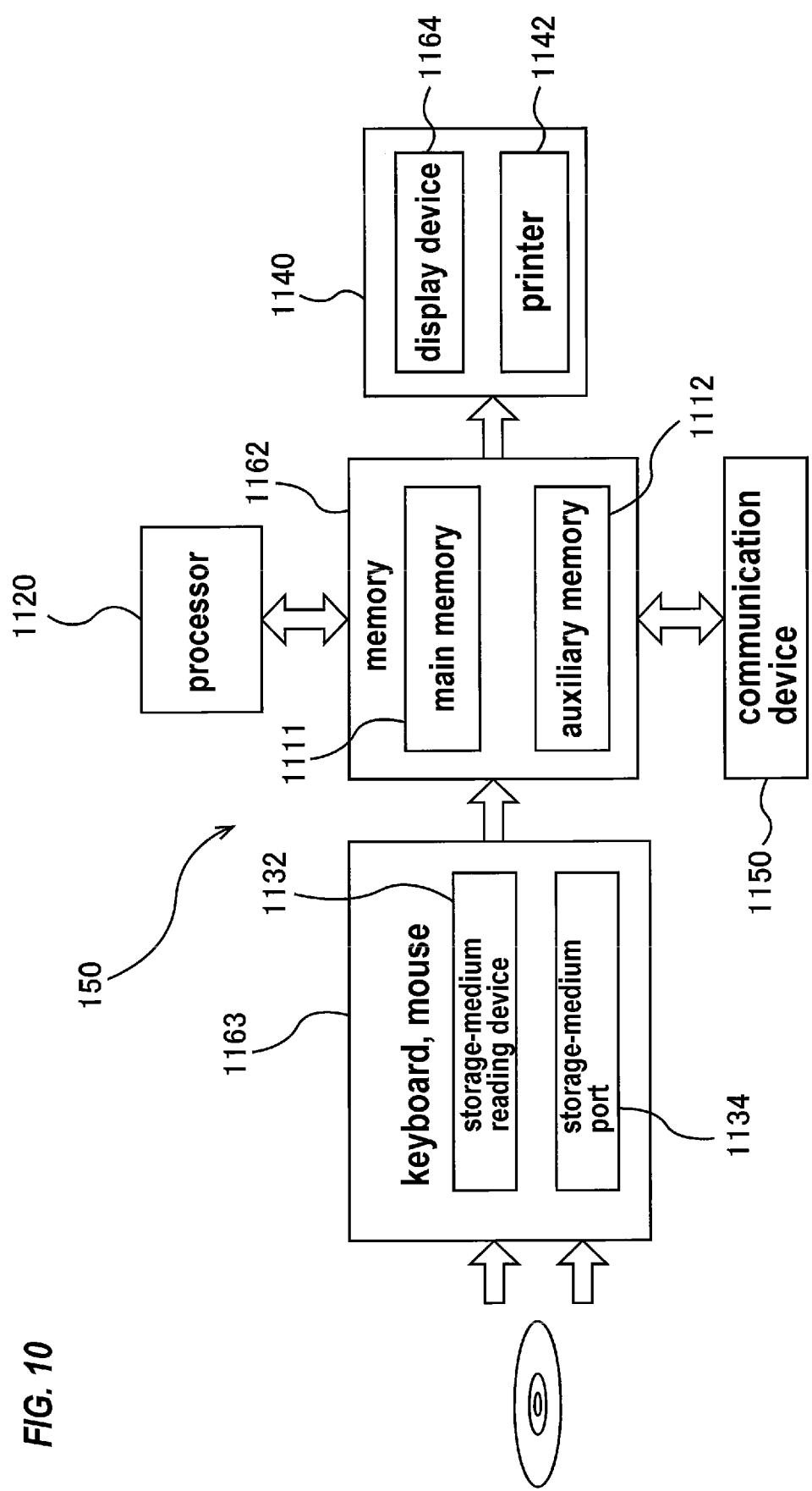
FIG. 10 is a schematic diagram showing an embodiment of a computer shown in FIG. 1.

FIG. 10 is a schematic diagram showing the configuration of the computer 150. The computer 150 includes a memory 1162 storing programs and data therein, a processor 1120, such as a CPU (central processing unit), configured to perform arithmetic operations in accordance with the programs stored in the memory 1162, an input device 1163 for inputting data, programs, and various information into the memory 1162, an output device 1140 for outputting a processing result and processed data, and a communication device 1150 for connecting to a network, such as the Internet.

The memory 1162 includes a main memory 1111 that can be accessed by the processor 1120, and an auxiliary memory 1112 that stores the data and the programs therein. The main memory 1111 is, for example, a random access memory (RAM), and the auxiliary memory 1112 is a storage device, such as a hard disk drive (HDD) or a solid state drive (SSD).

The input device 1163 includes a keyboard and a mouse, and further includes a storage-medium reading device 1132 for reading data from a storage medium, and a storage-medium port 1134 to which a storage medium is connected. The storage medium is a non-transitory tangible computer-readable storage medium, such as an optical disk (e.g., CD-ROM, DVD-ROM) or a semiconductor memory (e.g., USB flash drive, memory card). Examples of the storage-medium reading device 1132 include an optical drive (e.g., a CD drive or a DVD drive) and a card reader. An example of the storage-medium port 1134 is a USB terminal. The programs and/or data electrically stored in the storage medium are introduced into the computer 150 via the input device 1163, and stored in the auxiliary memory 1112 of the memory 1162. The output device 1140 includes a display device 1164 and a printing device 1142.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to an autofocus technique using interlace scan for a scanning electron microscope.

REFERENCE SIGNS LIST 100 scanning electron microscope
111 electron gun
112 converging lens
113 X deflector
114 Y deflector
115 objective lens
116 lens controller
117 deflection controller
118 image acquisition device
120 specimen chamber
121 XY stage
122 stage controller
124 wafer
130 secondary electron detector
131 backscattered electron detector
140 specimen transporting device
150 computer
160 pattern
165 field of view
170 approximate curve

The invention claimed is:

1. An autofocus method for a scanning electron microscope, comprising:
    generating a sequence of thinned images of a pattern formed on a surface of a specimen, each thinned image of the sequence of thinned images generated by repeatedly scanning a specimen with an electron beam along nonoverlapping scan lines while shifting a scanning position of the electron beam between scan lines by a predetermined natural number of pixels greater than one in a direction perpendicular to a scanning direction, each thinned image having fewer scan lines distributed evenly over a field of view than a combined image;
    changing a focal position and an irradiation position of the electron beam after generating each thinned image of the sequence of thinned images to interlace the scan lines of the sequence of thinned images;
    calculating a sharpness level of each thinned image of the respective thinned images to provide a plurality of sharpness levels; and
    determining an optimum focal position of the electron beam based on the plurality of sharpness levels.

2. The autofocus method according to claim 1, wherein said changing the focal position comprises changing a voltage applied to a deflector of the scanning electron microscope to change the focal position.

3. The autofocus method according to claim 1, wherein a scanning range of the electron beam when generating the thinned image covers an entire field of view of the scanning electron microscope.

4. The autofocus method according to claim 3 wherein the scan lines of each thinned image of the plurality of thinned images does not overlap scan lines of at least one other thinned image of the plurality of thinned images of the plurality of thinned images.

5. The autofocus method according to claim 1 wherein there are at least a scan line of a second thinned image of the plurality of thinned images and a scan line of a third thinned image of the plurality of thinned images interleaved between pairs of successive lines of a first thinned image of the plurality of thinned images.

6. The autofocus method according to claim 1 wherein the scan lines of each thinned image of the plurality of thinned images does not overlap scan lines of at least one other thinned image of the plurality of thinned images of the plurality of thinned images.

7. The autofocus method according to claim 1, wherein the thinned images of the pattern comprise thinned images of different portions of the pattern that do not overlap.

8. A scanning electron microscope, comprising:
    a source of primary electrons;
    converging and objective lenses configured to focus the primary electrons into a beam and onto a specimen;
    X and Y deflectors configured to scan the primary electrons across a surface of the specimen; a secondary electron detector;
    a computer configured to control the X and Y deflectors and a focus of the objective lens, and to generate images in memory from signals received from the secondary electron detector while using the X and Y deflectors to scan the primary electrons across the specimen;
    wherein the computer is configured to control the X and Y deflectors and focus of the objective lens to perform steps comprising:
    generating a sequence of thinned images of a pattern formed on the surface of the specimen, each thinned image of the sequence of thinned images generated by repeatedly scanning a specimen with an electron beam along nonoverlapping scan lines while shifting a scanning position of the electron beam between scan lines by a predetermined natural number of pixels greater than one in a direction perpendicular to a scanning direction, each thinned image having fewer scan lines distributed evenly over a field of view than a combined image;
    changing a focal position and an irradiation position of the electron beam after generating each thinned image of the sequence of thinned images to interlace the scan lines of the sequence of thinned images;
    calculating a sharpness level of each thinned image of the respective thinned images to provide a plurality of sharpness levels; and
    determining an optimum focal setting of the objective lens based on the plurality of sharpness levels.

* * * * *